(12) United States Patent
Kim et al.

(10) Patent No.: US 10,872,653 B2
(45) Date of Patent: Dec. 22, 2020

(54) MEMORY MODULES, MEMORY SYSTEMS, AND METHODS OF OPERATING MEMORY MODULES

(71) Applicant: SAMSUNG ELECTRONICS CO., LTD., Suwon-si (KR)

(72) Inventors: Jong-Hoon Kim, Seoul (KR); Young Yun, Yongin-si (KR); Wang-Soo Kim, Seoul (KR); Yoo-Jeong Kwon, Hwaseong-si (KR); Si-Hoon Ryu, Suwon-si (KR); Young-Ho Lee, Seoul (KR); Sung-Joo Park, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/390,460

(22) Filed: Apr. 22, 2019

(65) Prior Publication Data

US 2020/0126609 A1    Apr. 23, 2020

(30) Foreign Application Priority Data

Oct. 17, 2018  (KR) .......................... 10-2018-0123522

(51) Int. Cl.
| | | |
|---|---|---|
| *G11C 7/10* | (2006.01) | |
| *G11C 11/4076* | (2006.01) | |
| *G11C 11/4074* | (2006.01) | |
| *G06F 3/06* | (2006.01) | |

(52) U.S. Cl.
CPC ........ *G11C 11/4076* (2013.01); *G06F 3/0604* (2013.01); *G06F 3/0659* (2013.01); *G06F 3/0673* (2013.01); *G11C 11/4074* (2013.01)

(58) Field of Classification Search
CPC ..................................................... G11C 29/023
USPC ......................................................... 365/193
See application file for complete search history.

(56) References Cited

U.S. PATENT DOCUMENTS

| | | | |
|---|---|---|---|
| 6,874,097 B1* | 3/2005 | Aliahmad | G06F 1/10 375/355 |
| 7,895,479 B2 | 2/2011 | Porterfield | |
| 8,533,538 B2 | 9/2013 | Chaudhuri et al. | |
| 9,177,632 B2 | 11/2015 | Giovannini et al. | |
| 9,490,030 B2 | 11/2016 | Kang et al. | |
| 9,595,314 B2 | 3/2017 | Jeon | |
| 9,627,029 B2 | 4/2017 | Morris et al. | |
| 10,242,723 B1* | 3/2019 | Jeter | G11C 7/222 |
| 2006/0056214 A1 | 3/2006 | Petersen et al. | |

(Continued)

*Primary Examiner* — Min Huang
(74) *Attorney, Agent, or Firm* — F. Chau & Associates, LLC

(57) ABSTRACT

A memory module includes semiconductor memory devices mounted on a circuit board and a control device mounted on the circuit board. The control device receives a command, an address, and a clock signal from an external device, and provides the command, the address, and the clock signal to the semiconductor memory devices. The control device, in a hidden training mode during a normal operation, performs a command/address training on at least one semiconductor memory device of the semiconductor memory devices by transmitting a first command/address and a first clock signal to the at least one semiconductor memory device and receiving a second command/address and a second clock signal in response to the first command/address and the first clock signal, from the at least one semiconductor memory device.

20 Claims, 16 Drawing Sheets

(56) References Cited

U.S. PATENT DOCUMENTS

2012/0250433 A1* 10/2012 Jeon ................ G06F 3/0629
  365/193
2018/0101492 A1* 4/2018 Cho .................... G06F 1/26

* cited by examiner

MEMORY MODULES, MEMORY SYSTEMS, AND METHODS OF OPERATING MEMORY MODULES

CROSS-REFERENCE TO RELATED APPLICATION

This application claims priority under 35 U.S.C. § 119 to Korean Patent Application No. 10-2018-0123522, filed on Oct. 17, 2018 in the Korean Intellectual Property Office (KIPO), the disclosure of which is incorporated by reference herein in its entirety.

TECHNICAL FIELD

Exemplary embodiments of the inventive concept relate to a memory module, a memory system, and a method of operating a memory module.

DISCUSSION OF RELATED ART

A semiconductor memory may be a memory device implemented using a semiconductor such as silicon (Si), germanium (Ge), gallium arsenide (GaAs), indium phospide (InP), or the like. Semiconductor memory devices are typically divided into volatile memory devices and nonvolatile memory devices.

A volatile memory device refers to a memory device in which stored data is lost when a power supply is shut down. On the other hand, a nonvolatile memory device refers to a memory device that retains stored data when a power supply is shut down.

Dynamic random access memory (DRAM), which is a kind of volatile memory device, is widely used as a working memory, a buffer memory, a main memory, or the like of a computing system due to its high access speed. Because a DRAM memory cell generally includes a capacitor and a transistor, it may be difficult to reduce a cell size beyond a certain level. Thus, it may be difficult to implement a high-capacity DRAM within a limited area. For implementing high-capacity, a plurality of DRAMs may be provided in the form of a memory module.

SUMMARY

According to an exemplary embodiment of the inventive concept, a memory module includes a plurality of semiconductor memory devices mounted on a circuit board and a control device mounted on the circuit board. The control device receives a command, an address, and a clock signal from an external device, and provides the command, the address, and the clock signal to the plurality of semiconductor memory devices. The control device, in a hidden training mode during a normal operation, performs a command/address training on at least one semiconductor memory device of the plurality of semiconductor memory devices by transmitting a first command/address and a first clock signal to the at least one semiconductor memory device and receiving a second command/address and a second clock signal in response to the first command/address and the first clock signal, from the at least one semiconductor memory device.

According to an exemplary embodiment of the inventive concept, a memory system includes a memory module and a memory controller to control the memory module. The memory module includes a plurality of semiconductor memory devices and a control device to control the plurality of semiconductor memory devices, and the plurality of semiconductor memory devices and the control device are mounted on a circuit board. The control device receives a command, an address, and a clock signal from the memory controller and provides the command, the address, and the clock signal to the plurality of semiconductor memory devices. The control device, in a hidden training mode during a normal operation, performs a command/address training on at least one semiconductor memory device of the plurality of semiconductor memory devices by transmitting a first command/address and a first clock signal to the at least one semiconductor memory device and receiving a second command/address and a second clock signal in response to the first command/address and the first clock signal, from the at least one semiconductor memory device.

According to an exemplary embodiment of the inventive concept, a method of operating a memory module, where the memory module includes a plurality of semiconductor memory devices and a control device to control the plurality of semiconductor memory devices, and the plurality of semiconductor memory devices and the control device are mounted on a circuit board, is provided. According to the method, an initial command/address training is performed, by the control device, on each of the plurality of semiconductor memory devices to store, in a register in the control device, an initial skew information on a skew between a command/address and a clock signal associated with each of the plurality of semiconductor memory devices in an initial training mode of the memory module, a normal operation is performed in each of the plurality of semiconductor memory devices, it is determined, by the control device, whether at least one of the plurality of semiconductor memory devices enters into a hidden training mode during the normal operation, a skew is adjusted, by the control device, by receiving a command/address and a clock signal from the at least one semiconductor memory device entering into the hidden training mode, and a normal operation is performed by the at least one semiconductor memory device based on the adjusted skew.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
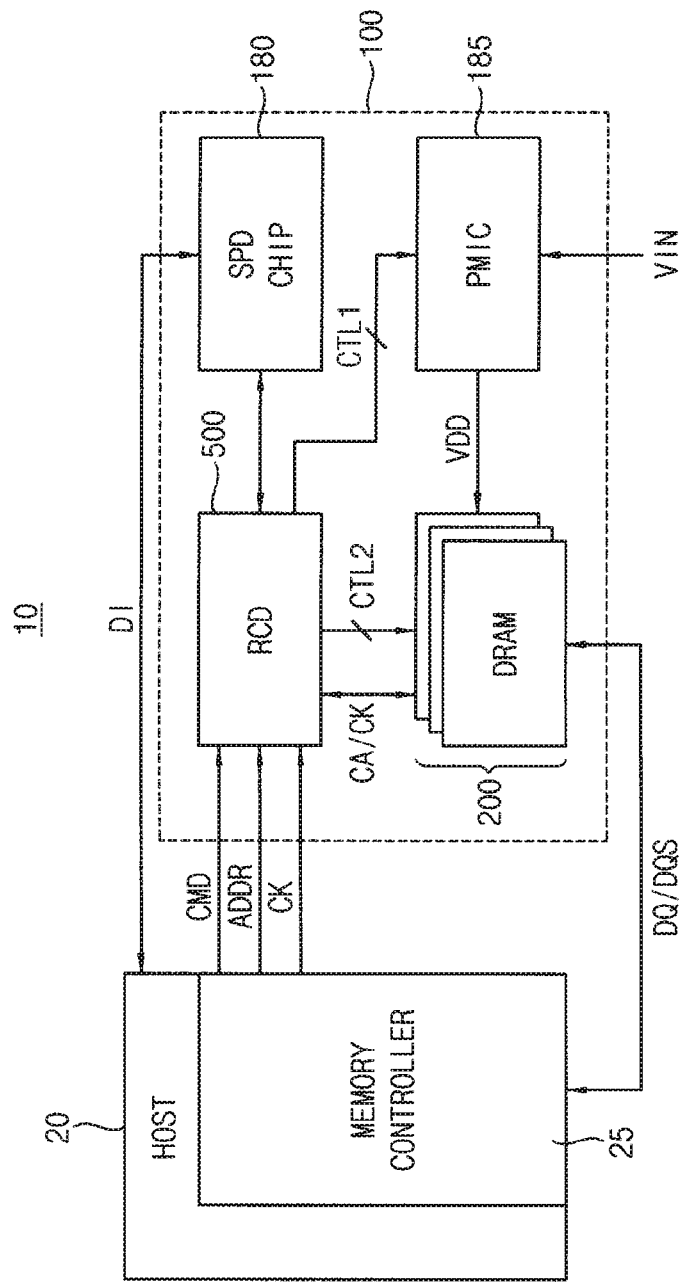
FIG. 1 is a block diagram illustrating a memory system according to an exemplary embodiment of the inventive concept.

Exemplary embodiments of the inventive concept provide a memory module capable of performing a command/address training autonomously.

Exemplary embodiments of the inventive concept also provide a memory system including the memory module capable of performing the command/address training autonomously.

Exemplary embodiments further provide a method of operating the memory module, capable of performing the command/address training autonomously.

Exemplary embodiments of the inventive concept will be described more fully hereinafter with reference to the accompanying drawings. Like reference numerals may refer to like elements throughout this application.

FIG. 1 is a block diagram illustrating a memory system according to an exemplary embodiment of the inventive concept.

Referring to FIG. 1, a memory system 10 includes a host 20 and a memory module 100. The host 20 may include a memory controller 25.

The memory module 100 may include a control device 500, a serial presence detect (SPD) chip 180, a power management integrated circuit (PMIC) 185, and semiconductor memory devices 200. The control device 500 may be a registered clock driver (RCD).

The control device 500 may control the semiconductor memory devices 200 and the PMIC 185 under control of the memory controller 25. For example, the control device 500 may receive an address ADDR, a command CMD, and a clock signal CK from the memory controller 25.

In response to received signals, the control device 500 may control the semiconductor memory devices 200 such that data received through a data signal DQ and a data strobe signal DQS is written in the semiconductor memory devices 200 or such that data stored in the semiconductor memory devices 200 is outputted through the data signal DQ and the data strobe signal DQS. For example, the control device 500 may transmit the address ADDR, the command CMD, and the clock signal CK from the memory controller 25 to the semiconductor memory devices 200.

The semiconductor memory devices 200 may write data received through the data signal DQ and the data strobe signal DQS under control of the control device 500. Alternatively, the semiconductor memory devices 200 may output the written data through the data signal DQ and the data strobe signal DQS under control of the control device 500.

For example, the semiconductor memory devices 200 may include a volatile memory device such as a dynamic random-access memory (DRAM), a static RAM (SRAM), or a synchronous DRAM (SDRAM). For example, the semiconductor memory devices 200 may be DRAM-based volatile memory devices. The semiconductor memory devices 200 may include a double data rate 5 (DDR5) SDRAM.

The SPD chip 180 may be a programmable read only memory (e.g., EEPROM). The SPD chip 180 may include initial information or device information DI of the memory module 100. In exemplary embodiments of the inventive concept, the SPD chip 180 may include the initial information or the device information DI such as a module form, a module configuration, a storage capacity, a module type, an execution environment, or the like of the memory module 100.

When the memory system 10 including the memory module 100 is booted up, the host 20 may read the device information DI from the SPD chip 180 and may recognize the memory module 100 based on the device information DI. The host 20 may control the memory module 100 based on the device information DI from the SPD chip 180. For example, the host 20 may recognize a type of the semiconductor memory devices 200 included in the memory module 100 based on the device information DI from the SPD chip 180.

In exemplary embodiments of the inventive concept, the SPD chip 180 may communicate with the host 20 through a serial bus. The host 20 may exchange a signal with the SPD chip 180 through the serial bus. The SPD chip 180 may communicate with the control device 500 through the serial bus. The serial bus may include at least one of 2-line serial buses such as an inter-integrated circuit (I2C), a system management bus (SMBus), a power management bus (PM-Bus), an intelligent platform management interface (IPMI), a management component transport protocol (MCTP), or the like.

The control device 500 may control the PMIC 185 through a first control signal CTL1, and may control the semiconductor memory devices 200 through a second control signal CTL2. The second control signal CTL2 may include the address ADDR, the command CMD, and the clock signal CK.

The control device 500 may exchange a command/address CA and the clock signal CK with at least some of the semiconductor memory devices 200 in a hidden training mode during a normal operation.

The PMIC 185 receives an input voltage VIN, generates a power supply voltage VDD based on the input voltage VIN, and provides the power supply voltage VDD to the semiconductor memory devices 200. The semiconductor memory devices 200 operate based on the power supply voltage VDD.

Figure 2:
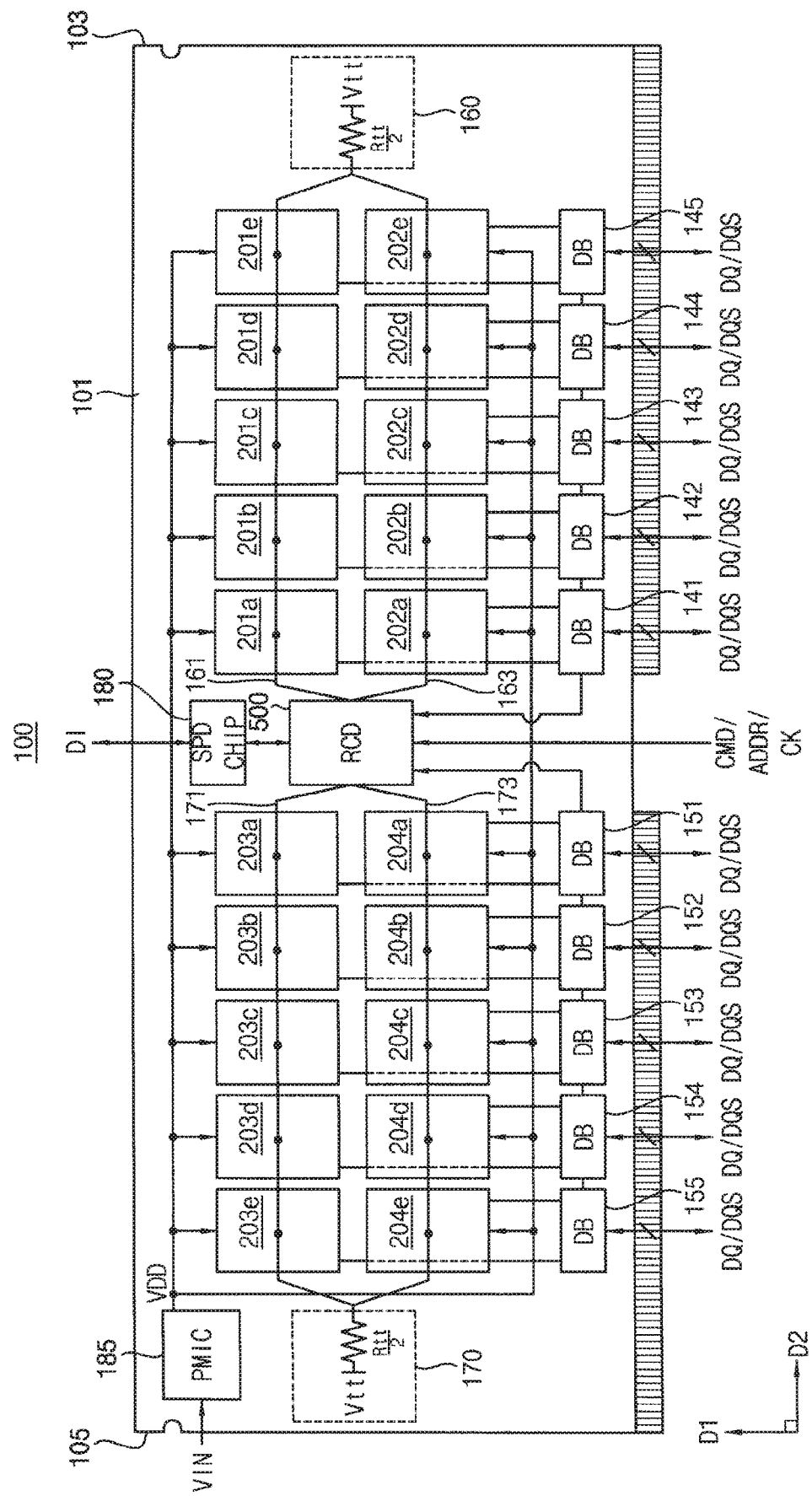
FIG. 2 is a block diagram illustrating a memory module in FIG. 1 in detail according to an exemplary embodiment of the inventive concept.

FIG. 2 is a block diagram illustrating a memory module in FIG. 1 in detail according to an exemplary embodiment of the inventive concept.

Referring to FIG. 2, the memory module 100 includes the control device 500 disposed (or mounted) in a circuit board 101, a plurality of semiconductor memory devices 201a~201e, 202a~202e, 203a~203e, and 204a~204e, a plurality of data buffers 141~145 and 151~155, module resistance units 160 and 170, the SPD chip 180, and the PMIC 185.

Here, the circuit board 101 which is a printed circuit board may extend in a second direction D2, perpendicular to a first direction D1, between a first edge portion 103 and a second edge portion 105. The first edge portion 103 and the second edge portion 105 may extend in the first direction D1.

The control device 500 may be disposed on a center of the circuit board 101. The plurality of semiconductor memory devices 201a~201e, 202a~202e, 203a~203e, and 204a~204e may be arranged in a plurality of rows between the control device 500 and the first edge portion 103 and between the control device 500 and the second edge portion 105. In this case, the semiconductor memory devices 201a~201e and 202a~202e may be arranged along a plurality of rows between the control device 110 and the first edge portion 103. The semiconductor memory devices 203a~203e, and 204a~204e may be arranged along a plurality of rows between the control device 500 and the second edge portion 105.

A portion of the semiconductor memory devices 201a~201e and 202a~202e may be an error correction code (ECC) memory device. The ECC memory device may perform an ECC encoding operation to generate parity bits about data to be written at memory cells of the plurality of semiconductor memory devices 201a~201e, 202a~202e, 203a~203e, and 204a~204e, and an ECC decoding operation to correct an error occurring in the data read from the memory cells.

Each of the plurality of semiconductor memory devices 201a~201e, 202a~202e, 203a~203e, and 204a~204e may be coupled to a corresponding one of the data buffers 141~145 and 151~155 through a data transmission line for receiving/transmitting the data signal DQ and the data strobe signal DQS.

The control device 500 may provide a command/address signal (e.g., CA) to the semiconductor memory devices 201a~201e through a command/address transmission line 161 and may provide a command/address signal to the semiconductor memory devices 202a~202e through a command/address transmission line 163. In addition, the control device 110 may provide a command/address signal to the semiconductor memory devices 203a~203e through a command/address transmission line 171 and may provide a command/address signal to the semiconductor memory devices 204a~204e through a command/address transmission line 173.

The command/address transmission lines 161 and 163 may be connected in common to the module resistance unit 160 disposed to be adjacent to the first edge portion 103, and the command/address transmission lines 171 and 173 may be connected in common to the module resistance unit 170 disposed to be adjacent to the second edge portion 105.

Each of the module resistance units 160 and 170 may include a termination resistor Rtt/2 connected to a termination voltage Vtt. In this case, an arrangement of the module resistance units 160 and 170 may reduce the number of the module resistance units, thus reducing an area where termination resistors are disposed.

In addition, each of the plurality of semiconductor memory devices 201a~201e, 202a~202e, 203a~203e, and 204a~204e may be a DDR5 SDRAM.

The SPD chip 180 is disposed to be adjacent to the control device 500 and the PMIC 185 may be disposed between the semiconductor memory device 203e and the second edge portion 105. The PMIC 185 may generate the power supply voltage VDD based on the input voltage VIN and may provide the power supply voltage VDD to the semiconductor memory devices 201a~201e, 202a~202e, 203a~203e, and 204a~204e.

Although it is illustrated as the PMIC 185 is disposed to be adjacent to the second edge portion 105 in FIG. 2, the PMIC 185 may be disposed in a central portion of the circuit board 101 to be adjacent to the control device 500 in exemplary embodiments of the inventive concept.

The control device 500, in a hidden training mode during a normal operation, may perform a command/address training on at least one semiconductor memory device of the plurality of semiconductor memory devices 201a~201e, 202a~202e, 203a~203e, and 204a~204e by transmitting a first command/address and a first clock signal to the at least one semiconductor memory and receiving a second command/address and a second clock signal in response to the first command/address and the first clock signal, from the at least one semiconductor memory device.

The control device 500 may receive the second command/address and the second clock signal from the at least one semiconductor memory device through a first loopback pin and a second loopback pin in the hidden training mode.

The control device 500 may receive the data signal DQ and the data strobe signal DQS from the at least one semiconductor memory device through the first loopback pin and the second loopback pin in an operation mode other than the hidden training mode.

Figure 3:
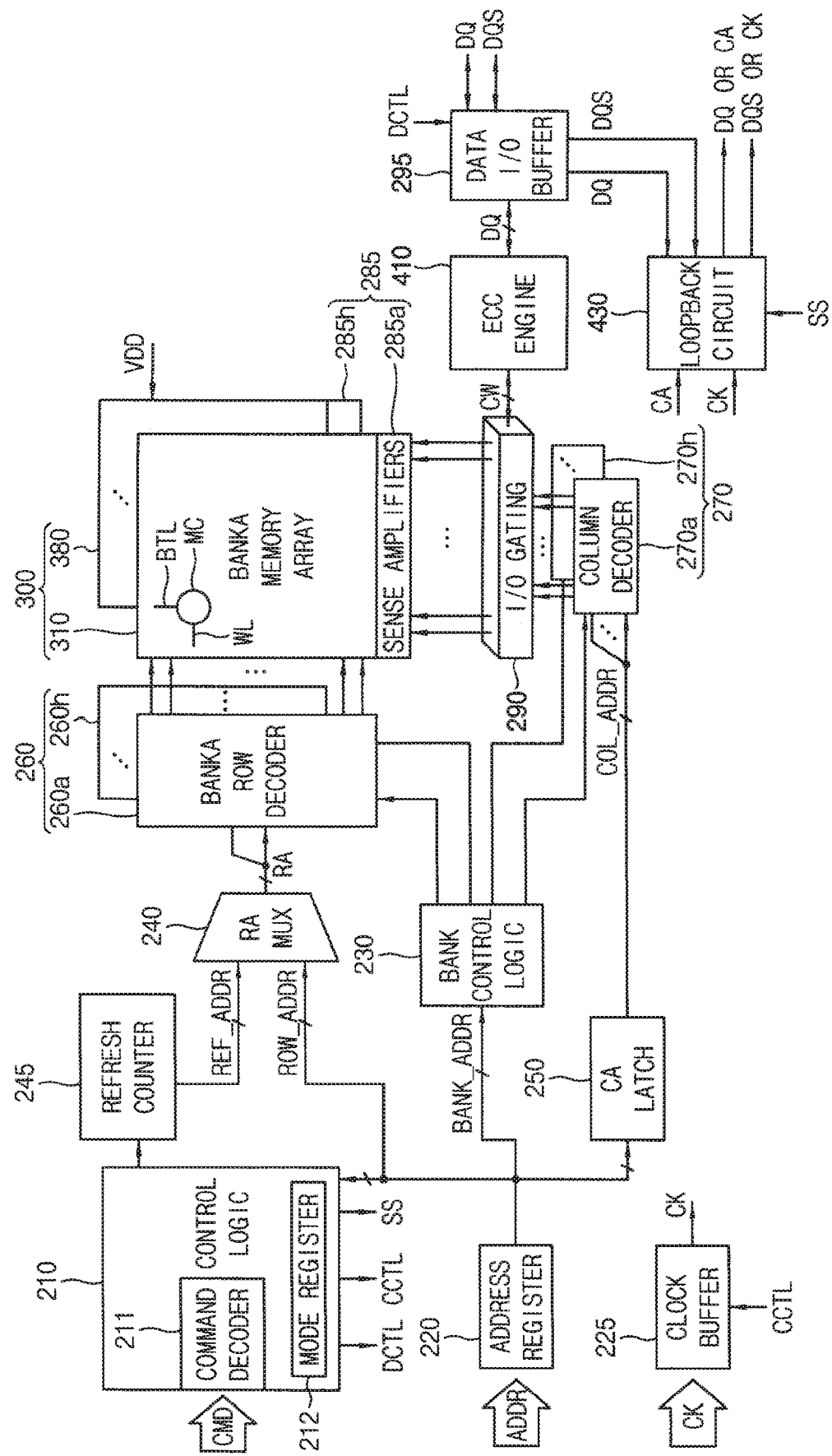
FIG. 3 is a block diagram illustrating a semiconductor memory device in FIG. 2 according to an exemplary embodiment of the inventive concept.

FIG. 3 is a block diagram illustrating a semiconductor memory device in FIG. 2 according to an exemplary embodiment of the inventive concept.

FIG. 3 illustrates a configuration of the semiconductor memory device 201a, and a configuration of each of the semiconductor memory devices 201b~201e, 202a~202e, 203a~203e, and 204a~204e is substantially the same as the configuration of the semiconductor memory device 201a.

Referring to FIG. 3, the semiconductor memory device 201a may include a control logic circuit 210, an address register 220, a clock buffer 225, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, a refresh counter 245, an ECC engine 410, and a loopback circuit 430.

The memory cell array 300 may include first through eighth bank arrays 310~380. The memory cell array 300 may operate based on the power supply voltage VDD.

The row decoder 260 may include first through eighth bank row decoders 260a~260h respectively coupled to the first through eighth bank arrays 310~380, the column decoder 270 may include first through eighth bank column decoders 270a~270h respectively coupled to the first through eighth bank arrays 310~380, and the sense amplifier unit 285 may include first through eighth bank sense amplifiers 285a~285h respectively coupled to the first through eighth bank arrays 310~380.

The first through eighth bank arrays 310~380, the first through eighth bank row decoders 260a~260h, the first through eighth bank column decoders 270a~270h, and the first through eighth bank sense amplifiers 285a~285h may form first through eighth banks.

Each of the first through eighth bank arrays 310~380 may include a plurality of word-lines WL, a plurality of bit-lines BTL, and a plurality of memory cells MC formed at intersections of the word-lines WL and the bit-lines BTL.

Although the semiconductor memory device 201a is illustrated in FIG. 3 as including eight banks, the semiconductor memory device 201a may include any number of banks.

The address register 220 may receive the address ADDR including a bank address BANK_ADDR, a row address ROW_ADDR, and a column address COL_ADDR from the control device 500. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may generate a word-line driving voltage based on the power supply voltage VDD and may apply the word-line driving voltage to the word-line corresponding to the row address RA.

The column address latch 250 may receive the column address COL_ADDR from the address register 220, and may temporarily store the received column address COL_ADDR. In exemplary embodiments of the inventive concept, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the I/O gating circuit 290 to output data corresponding to the column address COL_ADDR.

The I/O gating circuit 290 may include circuitry for gating input/output data. The I/O gating circuit 290 may further include read data latches for storing data that is output from the first through eighth bank arrays 310~380, and write drivers for writing data to the first through eighth bank arrays 310~380.

Data to be read from one bank array of the first through eighth bank arrays 310~380 may be sensed by a sense amplifier coupled to the one bank array from which the data is to be read, and may be stored in the read data latches.

The data stored in the read data latches may be provided to the memory controller 25 via the data I/O buffer 295 after the ECC engine 410 performs an ECC decoding on the data. Data to be written in one bank array of the first through eighth bank arrays 310~380 may be provided to the data I/O buffer 295 from the memory controller 25. The ECC engine 410 performs an ECC encoding on the data provided to the data I/O buffer 295, and the ECC engine 410 provides the encoded data to the I/O gating circuit 290.

The data I/O buffer 295, in a write operation of a normal mode, may provide the data signal DQ to the ECC engine 410. The data I/O buffer 295, in a read operation of the normal mode, may receive the data signal DQ from the ECC engine 410 and may provide the data signal DQ and the data strobe signal DQS to the memory controller 25.

The data I/O buffer 295, in a bit error rate test mode, may provide the data signal DQ and the data strobe signal DQS to the loopback circuit 430. The data I/O buffer 295 may operate based on a control signal DCTL from the control logic circuit 210.

The clock buffer 225 may provide the clock signal CK to a core unit of the semiconductor memory device 201a in the normal mode. The clock buffer 225 may provide the clock signal CK directly to the loopback circuit 430 in the hidden training mode. The clock buffer 225 may operate based on a control signal CCTL from the control logic circuit 210.

The loopback circuit 430 may provide the data signal DQ and the data strobe signal DQS to the control device 500 in the bit error rate test mode. The loopback circuit 430 may provide the command/address CA and the clock signal CK to the control device 500 in the hidden training mode. The loopback circuit 430 may operate based on a selection signal SS from the control logic circuit 210.

The control logic circuit 210 may control operations of the semiconductor memory device 201a. For example, the control logic circuit 210 may generate control signals for the semiconductor memory device 201a to perform a write operation or a read operation. The control logic circuit 210 may include a command decoder 211 that decodes the command CMD received from the memory controller 25 through the control device 500 and a mode register 212 that sets an operation mode of the semiconductor memory device 201a.

For example, the command decoder 211 may generate the control signals corresponding to the command CMD by decoding a write enable signal, a row address strobe signal, a column address strobe signal, a chip select signal, etc. The control logic circuit 210 may generate the control signal DCTL to control an operation of the data I/O buffer 295, generate the selection signal SS to control the loopback circuit 430, and generate the control signal CCTL to generate the clock buffer 225 according to an operation mode of the semiconductor memory device 201. The control logic circuit 210 may provide the control signal DCTL to the data I/O buffer 295, provide the selection signal SS to the loopback circuit 430, and provide the control signal CCTL to the clock buffer 225.

In exemplary embodiments of the inventive concept, the control device 500 may provide the selection signal SS directly to the loopback circuit 430.

Figure 4:
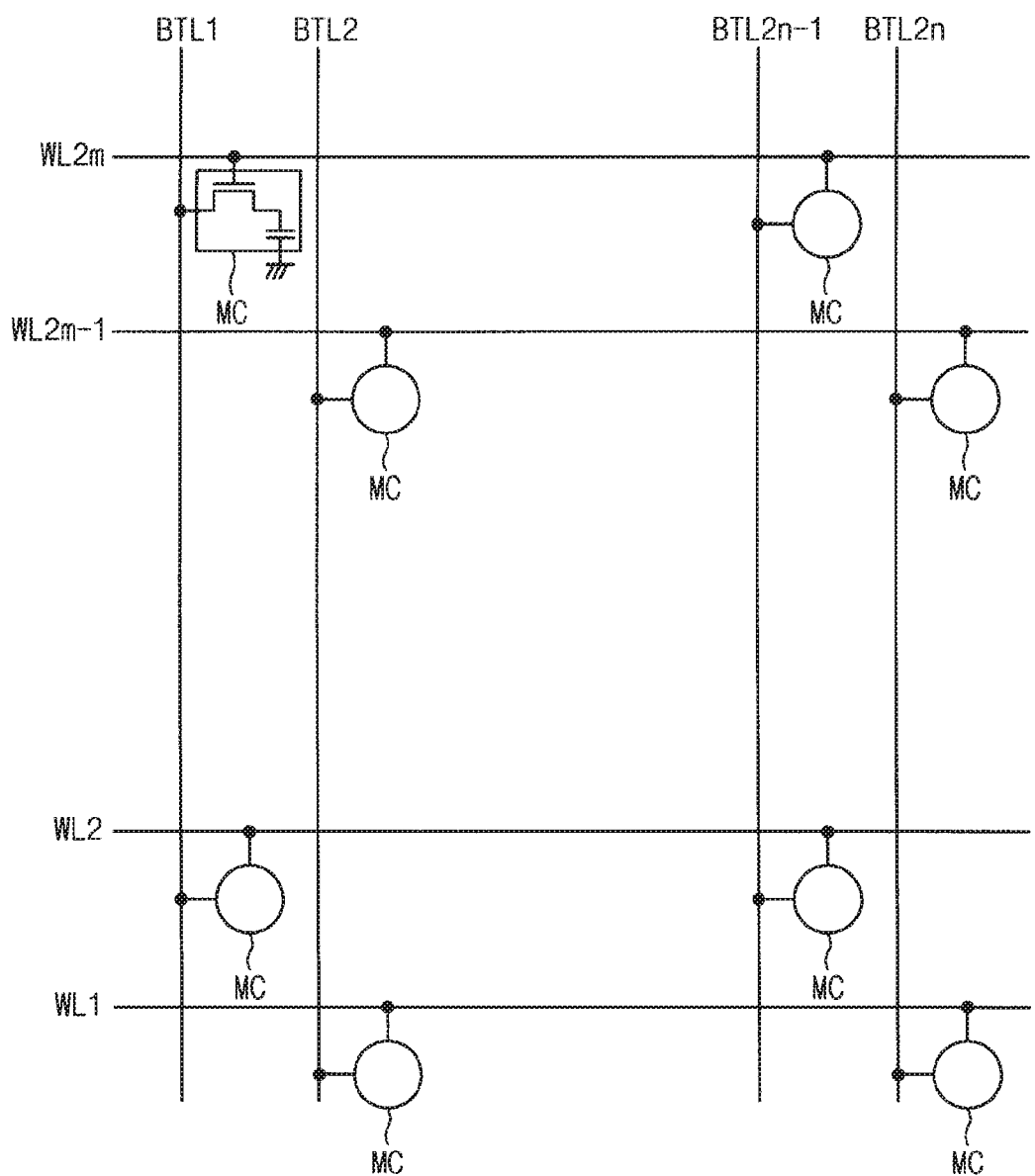
FIG. 4 illustrates a first bank array in the semiconductor memory device of FIG. 3 according to an exemplary embodiment of the inventive concept.

FIG. 4 illustrates a first bank array in the semiconductor memory device of FIG. 3 according to an exemplary embodiment of the inventive concept.

Referring to FIG. 4, the first bank array 310 includes a plurality of word-lines WL1~WL2m (where m is a natural number greater than two), a plurality of bit-lines BTL1~BTL2n (where n is a natural number greater than two), and a plurality of memory cells MCs disposed near intersections between the word-lines WL1~WL2m and the bit-lines BTL1~BTL2n. In an exemplary embodiment of the inventive concept, each of the plurality of memory cells MCs may include a DRAM cell structure. The plurality of word-lines WL1~WL2m to which the plurality of memory cells MCs are connected may be referred to as rows of the first bank array 310 and the plurality of bit-lines BTL1~BTL2n to which the plurality of memory cells MCs are connected may be referred to as columns of the first bank array 310.

Figure 5:
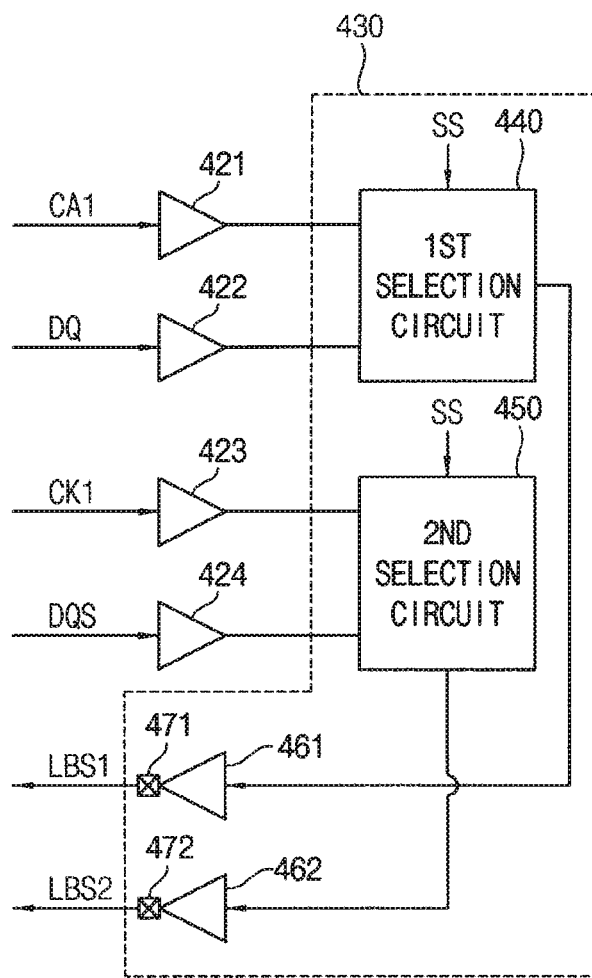
FIG. 5 is a block diagram illustrating a loopback circuit in the semiconductor memory device of FIG. 3 according to an exemplary embodiment of the inventive concept.

FIG. 5 is a block diagram illustrating a loopback circuit in the semiconductor memory device of FIG. 3 according to an exemplary embodiment of the inventive concept.

Referring to FIG. 5, the loopback circuit 430 may include a first selection circuit 440, a second selection circuit 450, a first transmitter 461, and a second transmitter 462. The first transmitter 461 may be coupled to a first loopback pin 471 and the second transmitter 462 may be coupled to a second loopback pin 472.

The first selection circuit 440 may select one of a first command/address CA1 from a first receiver 421 and the data signal DQ from a second receiver 422 in response to the selection signal SS and may provide the selected one to the first transmitter 461. The first selection circuit 440 may select the first command/address CA1 and provide the first command/address CA1 to the first transmitter 461 in the hidden training mode. The first selection circuit 440 may select the data signal DQ in the bit error rate test mode. The first transmitter 461 may transmit one of the first command/address CA1 and the data signal DQ as a first loopback signal LBS1 to the control device 500 through the first loopback pin 471.

The second selection circuit 450 may select one of a first clock CK1 from a third receiver 423 and the data strobe signal DQS from a fourth receiver 424 in response to the selection signal SS and may provide the selected one to the second transmitter 462. The second selection circuit 450 may select the first clock signal CK1 and provide the first clock signal CK1 to the second transmitter 462 in the hidden training mode. The second selection circuit 450 may select the data strobe signal DQS in the bit error rate test mode. The second transmitter 462 may transmit one of the first clock signal CK1 and the data strobe signal DQS as a second loopback signal LBS2 to the control device 500 through the second loopback pin 472.

In other words, the semiconductor memory device 201a may select the first command/address CA1 and the first clock signal CK1 in the hidden training mode during the normal operation and may transfer the first command/address CA1 and the first clock signal CK1 as a second command/address and a second clock signal to the control device 500 through the first loopback pin 471 and the second loopback pin 472, respectively.

The control device 500 may control the semiconductor memory device 201a such that the semiconductor memory device 201a enters into the hidden training mode right after the semiconductor memory device performs 201a refresh operation on a plurality of dynamic memory cells in the semiconductor memory device 201a.

The control device 500 may perform the command/address training on the semiconductor memory device 201a autonomously and in real time without intervention of the memory controller 25 in the hidden training mode.

Figure 6:
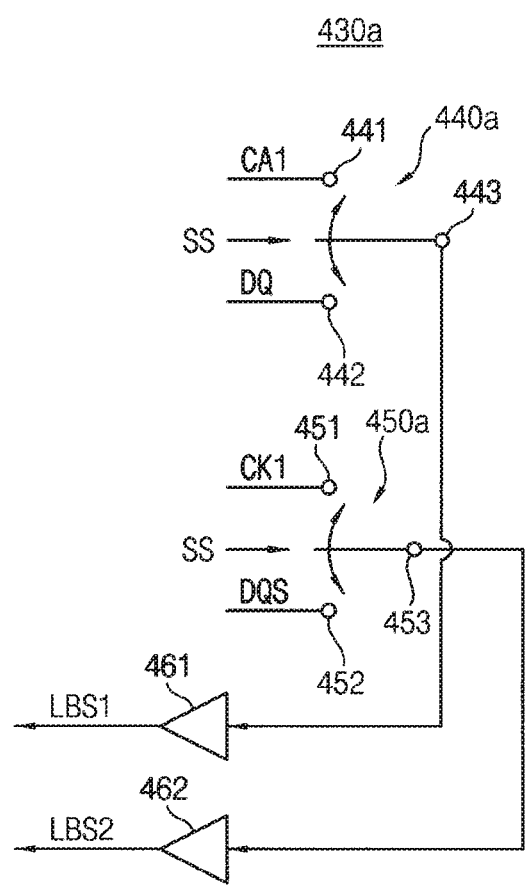
FIG. 6 is a circuit diagram illustrating first and second selection circuits in FIG. 5 according to an exemplary embodiment of the inventive concept.

FIG. 6 is a circuit diagram illustrating first and second selection circuits in FIG. 5 according to an exemplary embodiment of the inventive concept.

Referring to FIG. 6, a loopback circuit 430a may include a first switch 440a as the first selection circuit 440, a second switch 450a as the second selection circuit 450, the first transmitter 461, and the second transmitter 462.

The first switch 440a may have a first terminal 441 receiving the first command/address CA1, a second terminal 442 receiving the data signal DQ, and a third terminal 443 coupled to the first transmitter 461. The third terminal 443 is connected with one of the first terminal 441 and the second terminal 442 in response to the selection signal SS.

The second switch 450a may have a first terminal 451 receiving the first clock signal CK1, a second terminal 452 receiving the data strobe signal DQS, and a third terminal 453 coupled to the second transmitter 462. The third terminal 453 is connected with one of the first terminal 451 and the second terminal 452 in response to the selection signal SS.

Figure 7:
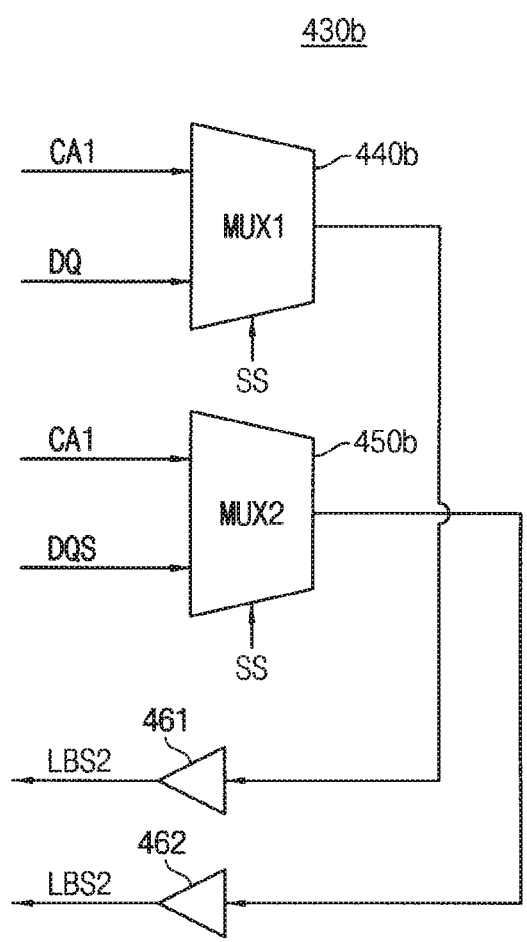
FIG. 7 is a circuit diagram illustrating first and second selection circuits in FIG. 5 according to an exemplary embodiment of the inventive concept.

FIG. 7 is a circuit diagram illustrating first and second selection circuits in FIG. 5 according to an exemplary embodiment of the inventive concept.

Referring to FIG. 7, a loopback circuit 430b may a first multiplexer 440b as the first selection circuit 440, a second multiplexer 450b as the second selection circuit 450, the first transmitter 461, and the second transmitter 462.

The first multiplexer 440b may have a first input terminal receiving the first command/address CA1, a second input terminal receiving the data signal DQ, an output terminal coupled to the first transmitter 461, and a control terminal receiving the selection signal SS. The first multiplexer 440b may select the first command/address CA1 in response to the selection signal SS in the hidden training mode. The first multiplexer 440b may select the data signal DQ in response to the selection signal SS in the bit error rate test mode.

The second multiplexer 450b may have a first input terminal receiving the first clock signal CK1, a second input terminal receiving the data strobe signal DQS, an output terminal coupled to the second transmitter 462, and a control terminal receiving the selection signal SS. The second multiplexer 450b may select the first clock signal CK1 in response to the selection signal SS in the hidden training mode. The second multiplexer 450b may select the data strobe signal DQS in response to the selection signal SS in the bit error rate test mode.

Therefore, each of the semiconductor memory devices 201a~201e, 202a~202e, 203a~203e, and 204a~204e may be a synchronous memory device that includes the first loopback pin 471 and the second loopback pin 472. The first loopback pin 471 may be used for transmitting the data signal DQ to the control device 500 in an operation mode other than the hidden training mode. The second loopback pin 472 may be used for transmitting the data strobe signal DQS to the control device in the operation mode other than the hidden training mode. The synchronous memory device may perform the command/address training by using the first loopback pin 471 and the second loopback pin 472 in the hidden training mode.

Figure 8:
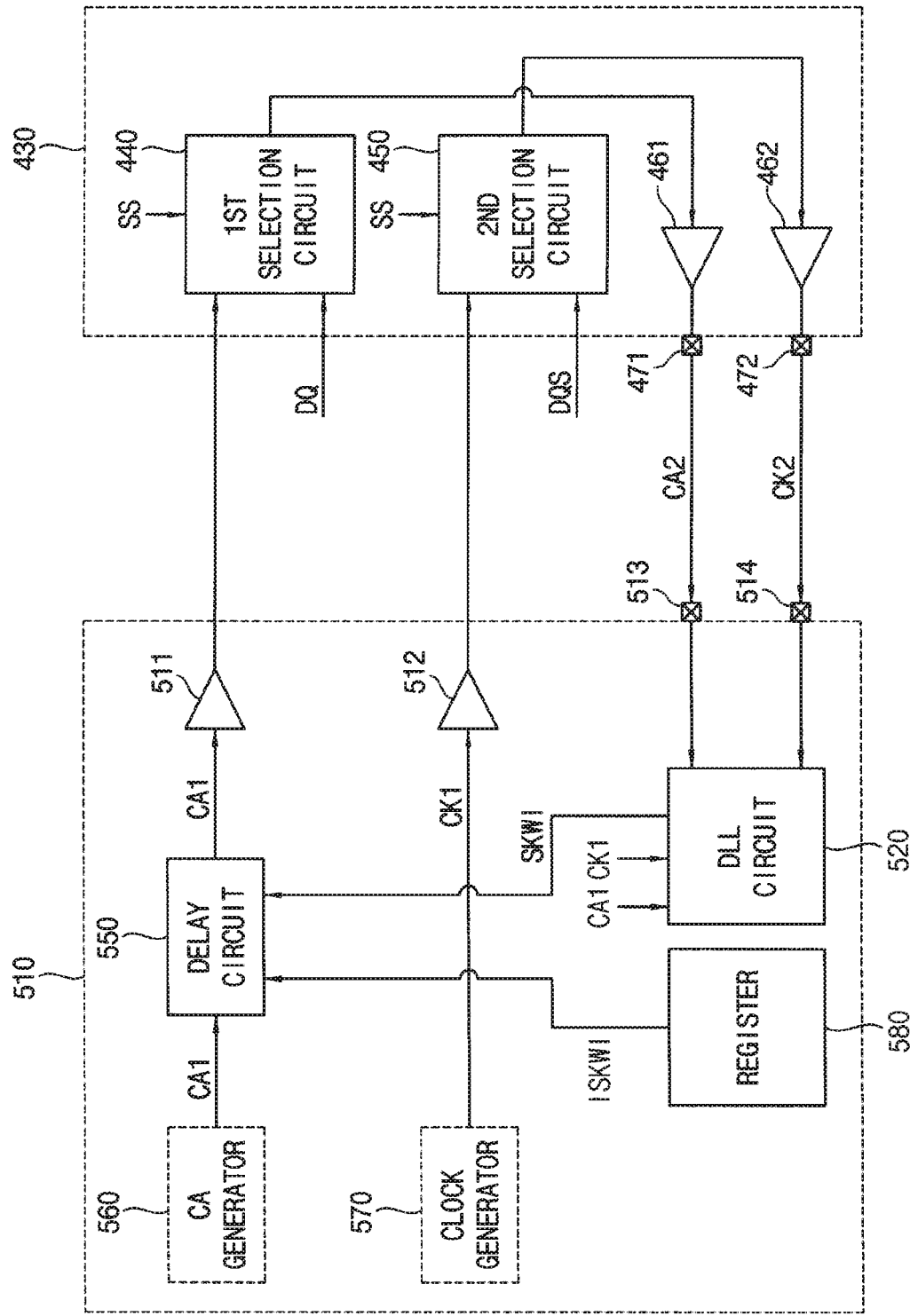
FIG. 8 illustrates a portion of a control device and a portion of the semiconductor memory device in the memory module of FIG. 2 according to an exemplary embodiment of the inventive concept.

FIG. 8 illustrates a portion of a control device and a portion of the semiconductor memory device in the memory module of FIG. 2 according to an exemplary embodiment of the inventive concept.

In FIG. 8, an interface circuit 510 included in the control device 500 and the loopback circuit 430 included in the semiconductor memory device 201*a* are illustrated.

Referring to FIG. 8, the interface circuit 510 may include transmitters 511 and 512, a delay-locked loop (DLL) circuit 520, a delay circuit 550, a command/address (CA) generator 560, a clock generator 570, and a register 580.

The CA generator 560 may generate the first command/address CA1 and provide the first command/address CA1 to the delay circuit 550 in the hidden training mode. The clock generator 570 may generate the first clock signal CK1 to provide the clock signal CK1 to the transmitter 512. The delay circuit 550 may selectively adjust an amount of a delay of the first command/address CA1 and provide the first selection circuit 440 in the loopback circuit 430 with the selectively adjusted first command/address CA1 through the transmitter 511.

The clock generator 570 may provide the first clock signal CK1 to the second selection circuit 450 in the loopback circuit 430 through the transmitter 512.

The DLL circuit 520 may receive a second command address CA2 through the first loopback pin 471 of the semiconductor memory device 201*a* and a first loopback pin 513 of the control device 500 and receive a second clock signal CK2 through the second loopback pin 472 of the semiconductor memory device 201*a* and a second loopback pin 514 of the control device 500.

The DLL circuit 520 detects a skew between the second command address CA2 and the second clock signal CK2 and provides the delay circuit 550 with a skew information SKWI on the detected skew. The delay circuit 550 may adjust an amount of delay of the first command/address CA1 to provide the adjusted first command/address CA1 to the loopback circuit 430.

In addition, the DLL circuit 520 may receive the first command/address CA1 and the first clock signal CK1 and may store information on a center of the first command/address CA1 and an edge of the first clock signal CK1.

The interface circuit 510 may receive the second command address CA2 and the second clock signal CK2 from the loopback circuit 430 through the first loopback pin 513 and the second loopback pin 514, respectively, in the hidden training mode.

In exemplary embodiments of the inventive concept, the DLL circuit 520 may detect the skew by detecting a difference between an edge of the second clock signal CK2 and a center of the second command/address CA2.

In exemplary embodiments of the inventive concept, the interface circuit 510 may perform an initial command/address training on the semiconductor memory device 201*a* to obtain an initial skew information ISKWI based on the initial command/address training and store the initial skew information ISKWI in the register 580. The delay circuit 550 may adjust an amount of the delay of the first command/address CA1 based on a comparison of the initial skew information ISKWI and the skew information SKWI.

In exemplary embodiments of the inventive concept, the DLL circuit 520 may detect a skew between an edge of the first clock signal CK1 and the second clock signal CK2 and may output the skew information SKWI on the detected skew.

In exemplary embodiments of the inventive concept, the DLL circuit 520 may detect a skew between a center of the first command/address CA1 and a center of the second command/address CA2 and may output the skew information SKWI on the detected skew.

Figures 9, 10:
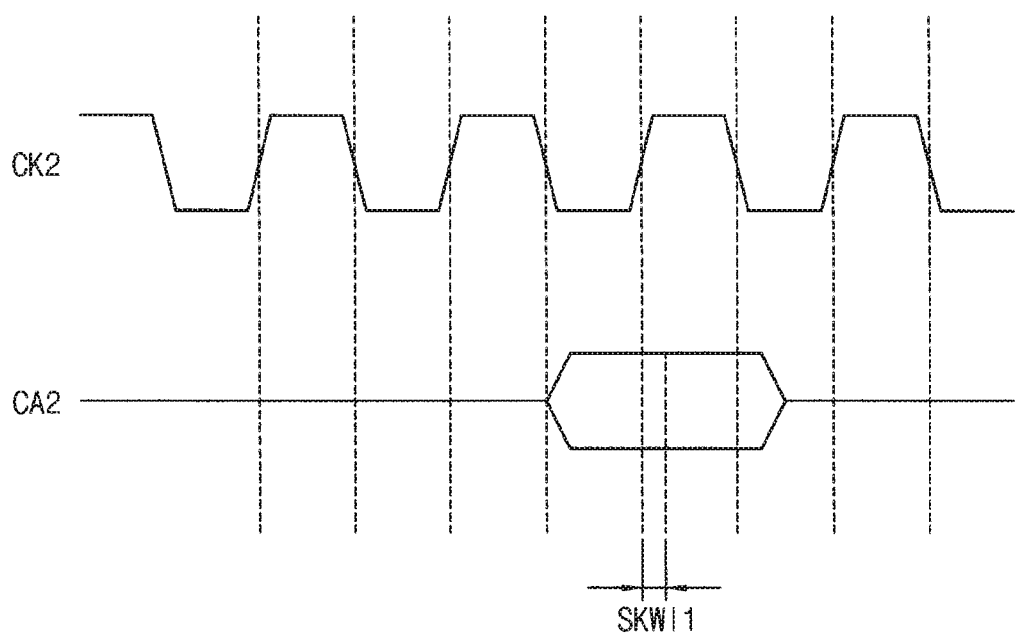
FIG. 9 illustrates a register in an interface circuit in FIG. 8 according to an exemplary embodiment of the inventive concept.
FIG. 10 is a timing diagram illustrating an operation of a delay-locked loop (DLL) circuit in FIG. 8 according to an exemplary embodiment of the inventive concept.

FIG. 9 illustrates a register in an interface circuit in FIG. 8 according to an exemplary embodiment of the inventive concept.

Referring to FIGS. 8 and 9, the control device 500 may perform an initial command/address training on each of the semiconductor memory devices 201*a*~201*e*, 202*a*~202*e*, 203*a*~203*e*, and 204*a*~204*e* to obtain initial skew information ISKWI1~ISKWIS associated with the semiconductor memory devices MD1~MDS based on the initial command/address training, and store the initial skew information initial skew information ISKWI1~ISKWIS in the register 580. The semiconductor memory devices MD1~MDS may correspond to the semiconductor memory devices 201*a*~201*e*, 202*a*~202*e*, 203*a*~203*e*, and 204*a*~204*e*.

FIG. 10 is a timing diagram illustrating an operation of a DLL circuit in FIG. 8 according to an exemplary embodiment of the inventive concept.

Referring to FIGS. 8 and 10, the DLL circuit 520 may detect a skew between an edge of the second clock signal CK2 and a center of the second command/address CA2 and may provide the delay circuit 550 with skew information SKWI1 on the detected skew.

Figure 11:
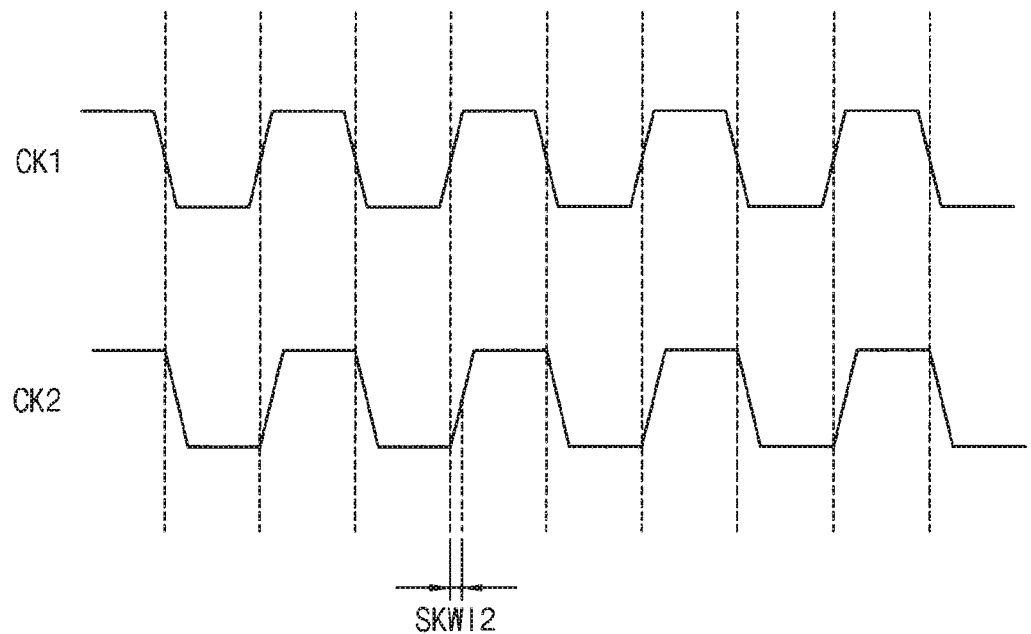
FIG. 11 is a timing diagram illustrating an operation of the DLL circuit in FIG. 8 according to an exemplary embodiment of the inventive concept.

FIG. 11 is a timing diagram illustrating an operation of the DLL circuit in FIG. 8 according to an exemplary embodiment of the inventive concept.

Referring to FIGS. 8 and 11, the DLL circuit 520 may detect a skew between an edge of the first clock signal CK1 and the second clock signal CK2 and may provide the delay circuit 550 with skew information SKWI2 on the detected skew.

Figure 12:
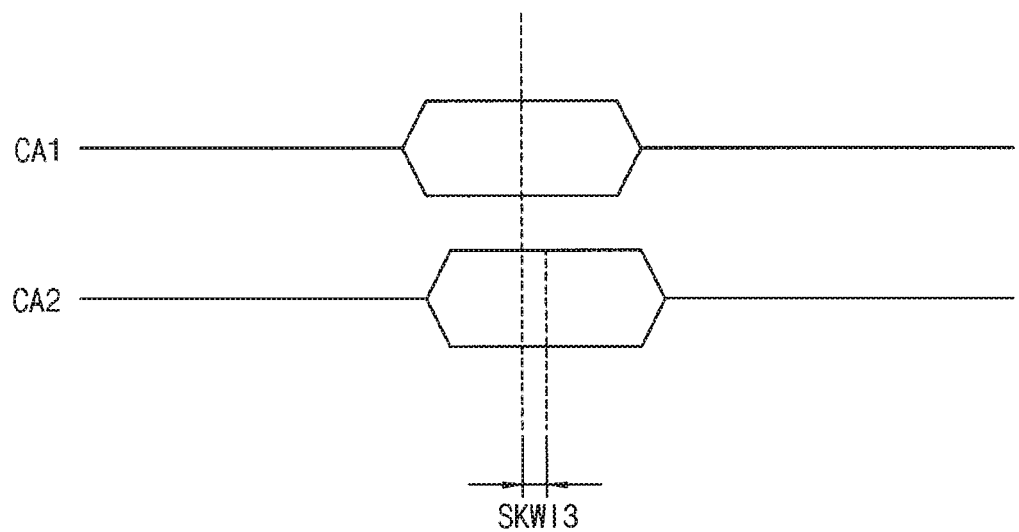
FIG. 12 is a timing diagram illustrating an operation of the DLL circuit in FIG. 8 according to an exemplary embodiment of the inventive concept.

FIG. 12 is a timing diagram illustrating an operation of the DLL circuit in FIG. 8 according to an exemplary embodiment of the inventive concept.

Referring to FIGS. 8 and 12, the DLL circuit 520 may detect a skew between a center of the first command/address CA1 and a center of the second command/address CA2, and may provide the delay circuit 550 with skew information SKWI3 on the detected skew. The first clock signal CK1 may be used as a reference signal when the DLL circuit 520 detects the skew between the center of the first command/address CA1 and the center of the second command/address CA2

Each of the first clock signal CK1 and the second clock signal CK2 may be a single-ended clock signal or a differential clock signal. When the first clock signal CK1 and the second clock signal CK2 are differential clock signals, edges of the first clock signal CK1 and the second clock signal CK2 may be detected based on crossing points of clock signal pairs.

Figure 13:
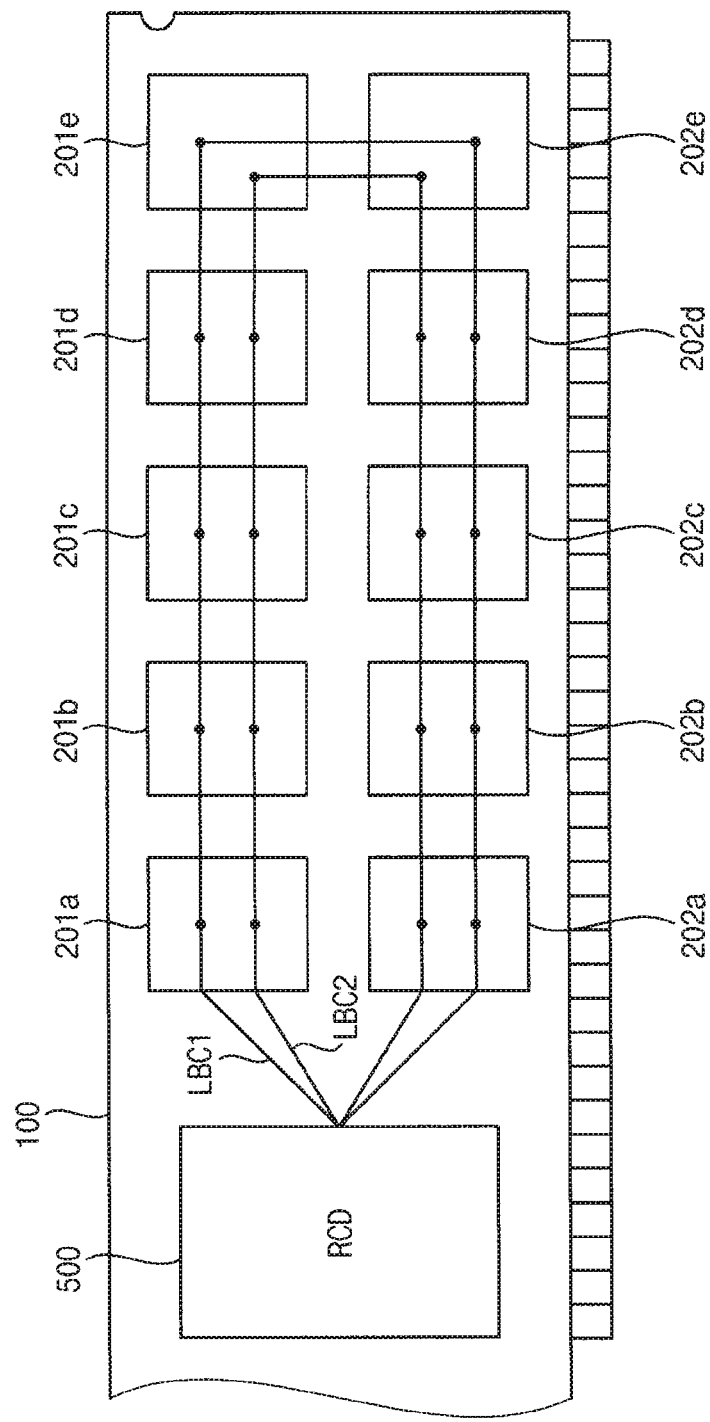
FIG. 13 illustrates a portion of the memory module of FIG. 2 according to an exemplary embodiment of the inventive concept.

FIG. 13 illustrates a portion of the memory module of FIG. 2 according to an exemplary embodiment of the inventive concept.

Referring to FIG. 13, the control device 500 may be connected to the semiconductor memory devices 201*a*~201*e* and 202*a*~202*e* through a first loopback channel LBC1 and a second loopback channel LBC2. Additionally, the control device 500 may be connected to the semiconductor memory devices 203*a*~203*e*, and 204*a*~204*e* through corresponding loopback channels (for example, a third loopback channel and a fourth loopback channel).

Figure 14:
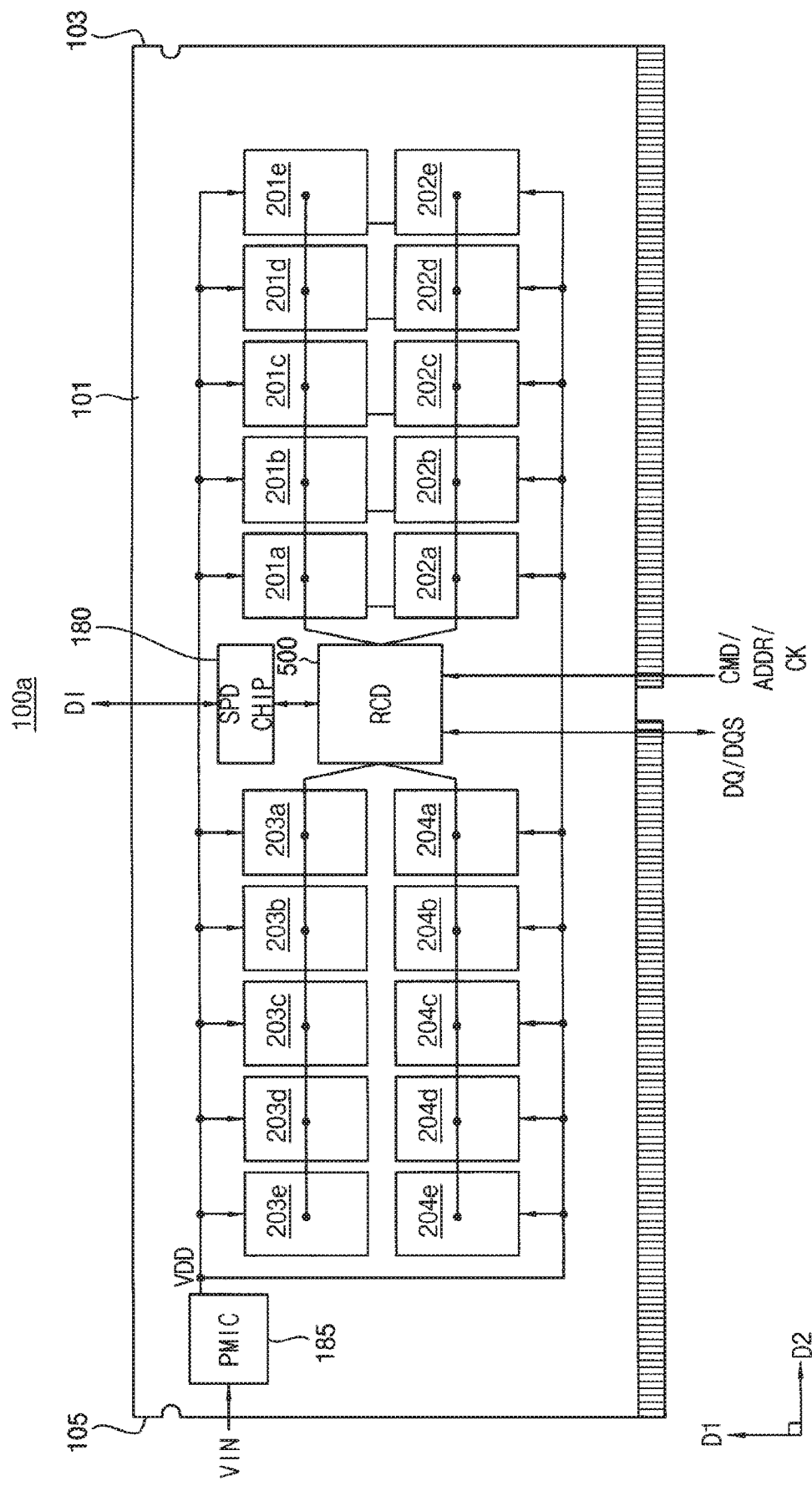
FIG. 14 is a block diagram illustrating a memory module in FIG. 1 according to an exemplary embodiment of the inventive concept.

FIG. 14 is a block diagram illustrating a memory module in FIG. 1 according to an exemplary embodiment of the inventive concept.

A memory module 100a of FIG. 14 differs from the memory module 100 of FIG. 2 in that the memory module 100a does not include data buffers which receive/transmit the data signal DQ and the data strobe signal DQS from/to the plurality of semiconductor memory devices 201a~201e, 202a~202e, 203a~203e, and 204a~204e. The memory module 100a may receive/transmit the data signal DQ and the data strobe signal DQS from/to the memory controller 25 through the control device 500.

Although it is illustrated as the PMIC 185 is disposed to be adjacent to the second edge portion 105 in FIG. 14, the PMIC 185 may be disposed in a central portion of the circuit board 101 to be adjacent to the control device 500 in exemplary embodiments of the inventive concept.

The control device 500, in the hidden training mode, may perform a command/address training on at least one semiconductor memory device of the plurality of semiconductor memory devices 201a~201e, 202a~202e, 203a~203e, and 204a~204e in real time by transmitting a first command/address and a first clock signal to the at least one semiconductor memory device, receiving a second command/address and a second clock signal in response to the first command/address and the first clock signal, from the at least one semiconductor memory device, and detecting a skew between the second command/address and the second clock signal to adjust an amount of delay of the first command/address.

Figure 15:
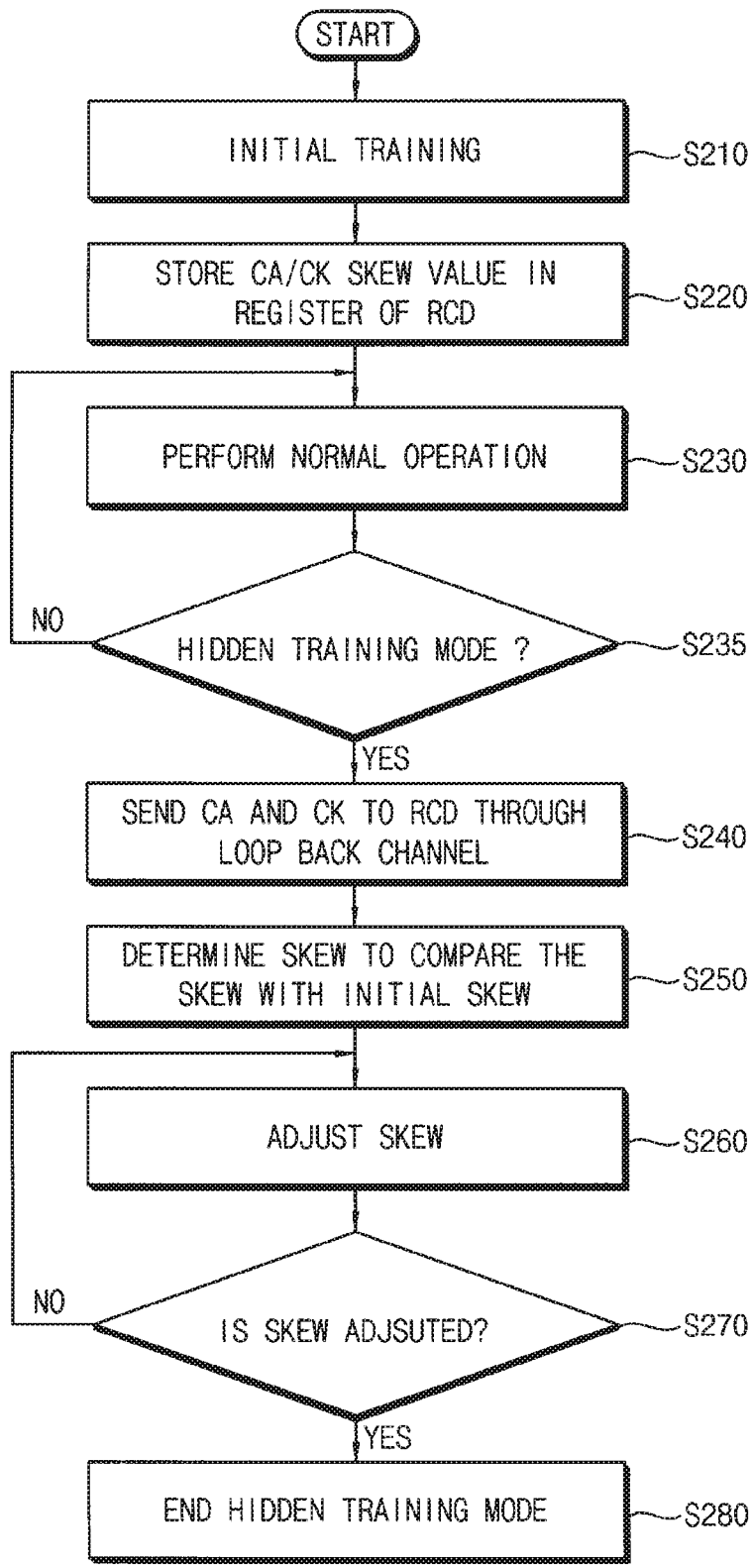
FIG. 15 is a flowchart illustrating a method of operating a memory module according to an exemplary embodiment of the inventive concept.

FIG. 15 is a flowchart illustrating a method of operating a memory module according to an exemplary embodiment of the inventive concept.

Referring to FIGS. 2 through 15, in a method of operating the memory module 100, which includes and the plurality of semiconductor memory devices 200 mounted on the circuit board 101 and the control device 500 to control plurality of semiconductor memory devices 200, the control device 500 performs an initial command/address training on each of the plurality of semiconductor memory devices 200 in an initial training mode (S210).

The control device 500 stores initial skew information on a skew between a command/address and a clock signal, associated with each of the semiconductor memory devices 200 in the register 580 based on a result of the initial training (S220).

The control device 500 controls the semiconductor memory devices 200 such that the semiconductor memory devices 200 perform normal operations (S230).

The control device 500 determines whether at least one of the semiconductor memory devices 200 enters into a hidden training mode during the normal operation (S235).

For example, at least one semiconductor memory device of the semiconductor memory devices 200 exiting from a self-refresh mode may enter into the hidden training mode.

When none of the semiconductor memory devices 200 enters into the hidden training mode (NO in S235), the process returns to operation S230.

When at least one of the semiconductor memory devices 200 enters into the hidden training mode (YES in S235), the at least one semiconductor memory device entering into the hidden training mode transmits a command/address and a clock signal to the control device 500 through a first loopback pin and a second loopback pin (or through a loopback channel) (S240).

The interface circuit 510 in the control device 500 determines a skew between the command/address and the clock signal and compares the determined skew with an initial skew determined in the initial training (S250).

The interface circuit 510 in the control device 500 adjusts an amount of delay of the command/address based on the comparison to transmit the adjusted command/address to the at least one semiconductor memory device (S260).

The interface circuit 510 in the control device 500 receives the adjusted command/address and the clock signal from the at least one semiconductor memory device and determines whether the skew is adjusted (S270).

When the skew is not adjusted (NO in S270), the process returns to operation S260.

When the skew is adjusted (YES in S270), the control device 500 ends the hidden training mode (S280).

Figure 16:
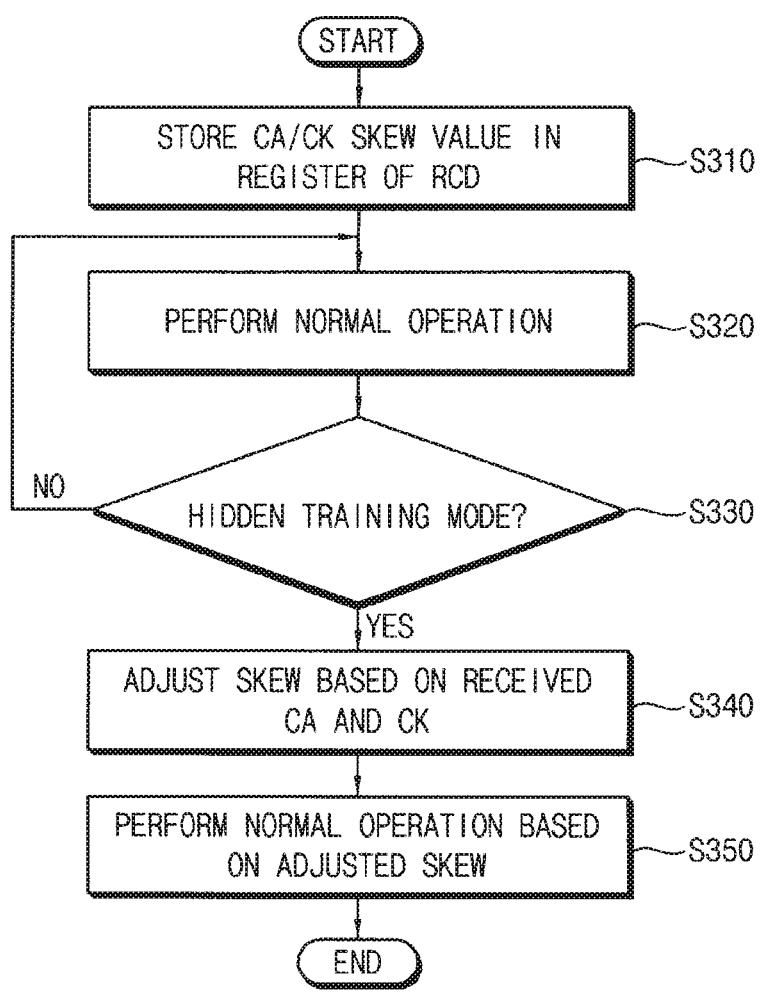
FIG. 16 is a flowchart illustrating a method of operating a memory module according to an exemplary embodiment of the inventive concept.

FIG. 16 is a flowchart illustrating a method of operating a memory module according to an exemplary embodiment of the inventive concept.

Referring to FIGS. 2 through 14 and 16, in a method of operating a memory module 100, which includes the plurality of semiconductor memory devices 200 mounted on the circuit board 101 and the control device 500 to control the plurality of semiconductor memory devices 200, the control device 500 performs an initial command/address training on each of the plurality of semiconductor memory devices 200 in an initial training mode to store initial skew information on a skew between a command/address and a clock signal, associated with each of the semiconductor memory devices 200, in the register 580 (S310).

The control device 500 controls the semiconductor memory devices 200 such that the semiconductor memory devices 200 perform normal operations (S320).

The control device 500 determines whether at least one of the semiconductor memory devices 200 enters into a hidden training mode during the normal operation (S330).

When none of the semiconductor memory devices 200 enters into the hidden training mode (NO in S330), the process returns to operation S320.

When at least one semiconductor memory device of the semiconductor memory devices 200 enters into the hidden training mode (YES in S330), the interface circuit 510 in the control device 500 receives a command/address and a clock signal from the at least one semiconductor memory device and adjusts a skew between the command/address and the clock signal (S340).

The at least one semiconductor memory device performs a normal operation based on the adjusted skew under control of the control device 500 (S350).

Figure 17:
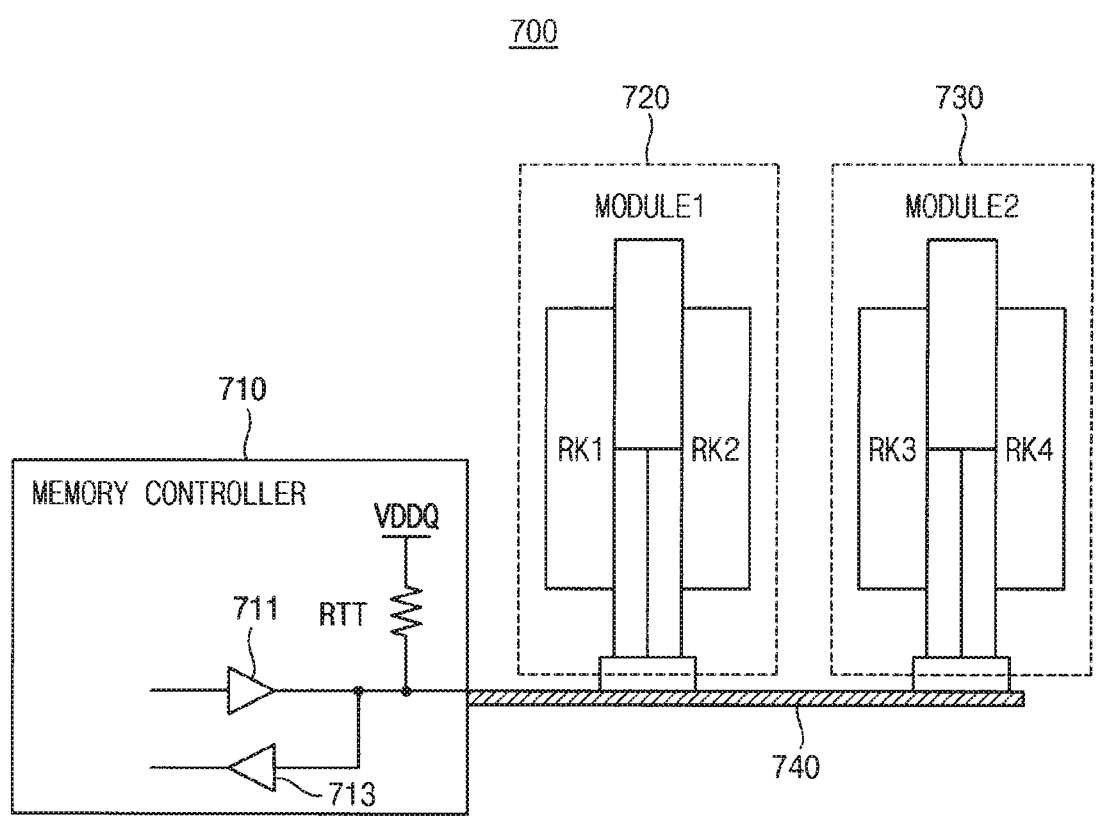
FIG. 17 is a block diagram illustrating a memory system having quad-rank memory modules according to an exemplary embodiment of the inventive concept.

FIG. 17 is a block diagram illustrating a memory system having quad-rank memory modules according to an exemplary embodiment of the inventive concept.

Referring to FIG. 17, a memory system 700 may include a memory controller 710 and at least one or more memory modules 720 and 730.

The memory controller 710 may control a memory module so as to perform a command supplied from a processor or host. The memory controller 710 may be implemented in a processor or host, or may be implemented with an application processor or a system-on-a-chip (SOC). For signal integrity, a source termination may be implemented with a resistor RTT on a bus 740 of the memory controller 710. The resistor RTT may be coupled to a power supply voltage VDDQ. The memory controller 710 may include a transmitter 711 to transmit a signal to the at least one or more memory modules 720 and 730 and a receiver 713 to receive a signal from the at least one or more memory modules 720 and 730.

The at least one or more memory modules 720 and 730 may be referred to as a first memory module 720 and a second memory module 730. The first memory module 720 and the second memory module 730 may be coupled to the memory controller 710 through the bus 740. Each of the first memory module 720 and the second memory modules 730 may correspond to the memory module 100 of FIG. 2 or the memory module 100*a* of FIG. 14. The first memory module 720 may include at least one or more memory ranks RK1 and RK2, and the second memory module 730 may include one or more memory ranks RK3 and RK4.

Each of the first memory module 720 and the second memory module 730 may include a control device including the interface circuit 510 in FIG. 8. The control device may perform a command/address training autonomously and in real time on at least one of a plurality of memory devices mounted on a circuit board through loopback channels in a hidden training mode during a normal operation to adjust a skew between a command/address and a clock signal. Therefore, each of the first memory module 720 and the second memory module 730 may enhance performance by improving a timing margin in the normal mode without intervention of the memory controller 710.

Figure 18:
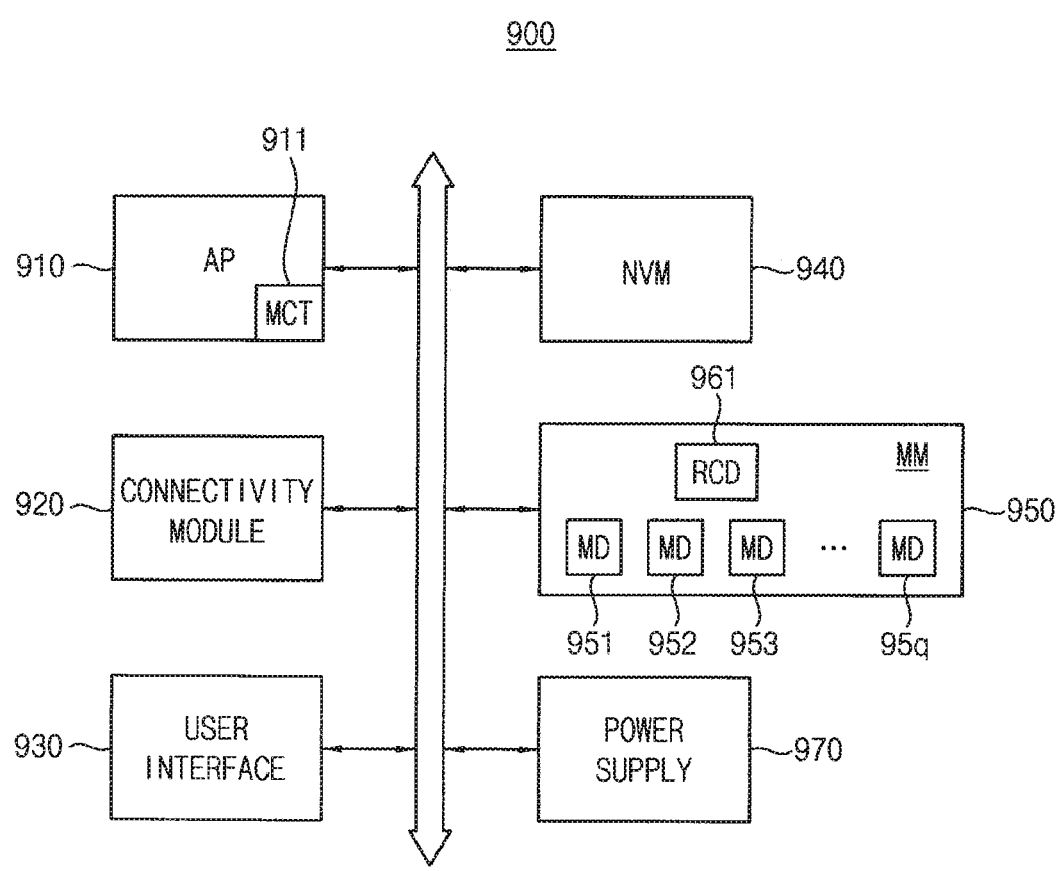
FIG. 18 is a block diagram illustrating a mobile system including a memory module according to an exemplary embodiment of the inventive concept.

FIG. 18 is a block diagram illustrating a mobile system including a memory module according to an exemplary embodiment of the inventive concept.

Referring to FIG. 18, a mobile system 900 may include an application processor 910, a connectivity module 920, a memory module 950, a nonvolatile memory device 940, a user interface 930, and a power supply 970. The application processor 910 may include a memory controller 911.

The application processor 910 may execute applications, such as a web browser, a game application, a video player, etc. The connectivity module 920 may perform wired or wireless communication with an external device.

The memory module 950 may store data processed by the application processor 910 or operate as a working memory. The memory module 950 may include a plurality of semiconductor memory devices (MD) 951~95*q* (where q is a natural number greater than three), and a control device 961. The control device 961 may include the interface circuit 510 in FIG. 8, and may perform a command/address training autonomously and in real time on at least one of a plurality of memory devices mounted on a circuit board through loopback channels in a hidden training mode during a normal operation to adjust a skew between a command/address and a clock signal.

The nonvolatile memory device 940 may store a boot image for booting the mobile system 900. The user interface 930 may include at least one input device, such as a keypad, a touch screen, etc., and at least one output device, such as a speaker, a display device, etc. The power supply 970 may supply an operating voltage to the mobile system 900.

In exemplary embodiments of the inventive concept, the mobile system 900 and/or components of the mobile system 900 may be packaged in various forms.

The inventive concept as described above may be applied to systems using memory modules.

Accordingly, in a memory module including a plurality of semiconductor memory devices and a control device to control the plurality of semiconductor memory devices, the control device may perform a command/address training autonomously and in real time on at least one of the plurality of semiconductor memory devices in a hidden training mode during a normal operation to adjust a skew between a command/address and a clock signal. Therefore, the memory module may have enhanced performance.

While the inventive concept has been shown and described with reference to exemplary embodiments thereof, it will be apparent to those of ordinary skill in the art that various modifications in form and details may be made thereto without materially departing from the spirit and scope of the inventive concept as set forth by the following claims.

What is claimed is:

1. A memory module comprising:
   a plurality of semiconductor memory devices mounted on a circuit board, at least one semiconductor memory device of the plurality of semiconductor memory devices including a loopback circuit, the loopback circuit including a first selection circuit and a second selection circuit; and
   a control device mounted on the circuit board, and configured to receive a command, an address, and a clock signal from an external device and to provide the command, the address, and the clock signal to the plurality of semiconductor memory devices,
   wherein the control device, in a hidden training mode during a normal operation, is configured to perform a command/address training on the at least one semiconductor memory device by transmitting a first command/address and a first clock signal to the at least one semiconductor memory device, and receiving a second command/address and a second clock signal in response to the first command/address and the first clock signal, from the at least one semiconductor memory device,
   wherein the first selection circuit is configured to select one of the first command/address or a data signal in response to a selection signal based on the hidden training mode, and the second selection circuit is configured to select one of the first clock signal or a data strobe signal in response to the selection signal.

2. The memory module of claim 1, wherein the at least one semiconductor memory device is configured to transmit the second command/address and the second clock signal to the control device through a first loopback pin and a second loopback pin, respectively, in the hidden training mode, under control of the control device.

3. The memory module of claim 2,
   wherein the loopback circuit further includes:
   a first transmitter coupled to the first selection circuit and the first loopback pin; and
   a second transmitter coupled to the second selection circuit and the second loopback pin.

4. The memory module of claim 3, wherein in the hidden training mode,
   the first selection circuit is configured to select the first command/address in response to the selection signal to provide the first command/address to the first transmitter, and
   the second selection circuit is configured to select the first clock signal in response to the selection signal to provide the first clock signal to the second transmitter.

5. The memory module of claim 3, wherein
   the first selection circuit includes a first switch that has a first terminal configured to receive the first command/address, a second terminal configured to receive the data signal, and a third terminal coupled to the first transmitter, and
   the second selection circuit includes a second switch that has a first terminal configured to receive the first clock signal, a second terminal configured to receive the data strobe signal, and a third terminal coupled to the second transmitter.

6. The memory module of claim 3, wherein
the first selection circuit includes a first multiplexer that has a first input terminal configured to receive the first command/address, a second input terminal configured to receive the data signal, an output terminal coupled to the first transmitter, and a control terminal configured to receive the selection signal, and
the second selection circuit includes a second multiplexer that has a first input terminal configured to receive the first clock signal, a second input terminal configured to receive the data strobe signal, an output terminal coupled to the second transmitter, and a control terminal configured to receive the selection signal.

7. The memory module of claim 1, wherein the control device includes an interface circuit,
wherein the interface circuit is configured to perform the command/address training in the hidden training mode by:
receiving the second command/address and the second clock signal;
detecting a skew between the second command/address and the second clock signal; and
adjusting a delay of the first command/address based on the detected skew, and
wherein the interface circuit is configured to detect the skew by detecting a difference between an edge of the second clock signal and a center of the second command/address.

8. The memory module of claim 7, wherein the interface circuit includes:
a delay-locked loop circuit configured to receive the second command/address and the second clock signal, to detect the skew between the second command/address and the second clock signal, and to output a skew information on the detected skew, in the hidden training mode; and
a delay circuit configured to adjust an amount of the delay of the first command/address based on the skew information to output an adjusted command/address.

9. The memory module of claim 8, wherein the control device is configured to receive the second command/address and the second clock signal from the at least one semiconductor memory device through a first loopback pin and a second loopback pin, respectively, in the hidden training mode.

10. The memory module of claim 8, wherein the interface circuit is configured to perform an initial command/address training on the at least one semiconductor memory device to obtain an initial skew information based on the initial command/address training,
the interface circuit further includes a register configured to store the initial skew information, and
the delay circuit is configured to adjust an amount of the delay of the first command/address based on a comparison of the initial skew information and the skew information.

11. The memory module of claim 1, wherein the control device includes an interface circuit, and
wherein the interface circuit is configured to perform the command/address training in the hidden training mode by:
receiving the second command/address and the second clock signal;
detecting a phase difference between an edge of the first clock signal and an edge of the second clock signal; and
adjusting a delay of the first command/address based on the detected phase difference.

12. The memory module of claim 11, wherein the interface circuit includes:
a delay-locked loop circuit configured to receive the second command/address and the second clock signal, to detect the phase difference between the edge of the first clock signal and the edge of the second clock signal, and to output a skew information on the detected phase difference, in the hidden training mode; and
a delay circuit configured to adjust an amount of the delay of the first command/address based on the skew information to output an adjusted command/address.

13. The memory module of claim 1, wherein the control device includes an interface circuit,
wherein the interface circuit is configured to perform the command/address training in the hidden training mode by:
receiving the second command/address and the second clock signal;
detecting a skew between the first command/address and the second command/address; and
adjusting a delay of the first command/address based on the detected skew, and
wherein the interface circuit is configured to detect the skew by detecting a difference between a center of the first command/address and a center of the second command/address.

14. The memory module of claim 13, wherein the interface circuit includes:
a delay-locked loop circuit configured to receive the second command/address and the second clock signal, to detect the skew between the center of the first command/address and the center of the second command/address, and to output a skew information on the detected skew, in the hidden training mode; and
a delay circuit configured to adjust an amount of the delay of the first command/address based on the skew information to output an adjusted command/address.

15. The memory module of claim 1, wherein the at least one semiconductor memory device includes a memory cell array including a plurality of dynamic memory cells coupled to a plurality of word-lines and a plurality of bit-lines, and
wherein the control device is configured to control the at least one semiconductor memory device such that the at least one semiconductor memory device enters into the hidden training mode after the at least one semiconductor memory device performs a refresh operation on the plurality of dynamic memory cells.

16. The memory module of claim 1, further comprising:
a power management integrated circuit (PMIC) mounted on the circuit board,
wherein the PMIC is configured to generate a power supply voltage based on an input voltage and to provide the power supply voltage to the plurality of semiconductor memory devices.

17. The memory module of claim 1, wherein each of the plurality of semiconductor memory devices is a synchronous memory device,
the synchronous memory device includes a first loopback pin and a second loopback pin,
the first loopback pin configured to transmit a data signal to the control device in an operation mode other than the hidden training mode
the second loopback pin is configured to transmit a data strobe signal to the control device in the operation mode other than the hidden training mode, and the synchronous memory device performs the command/address training using the first loopback pin and the second loopback pin in the hidden training mode.

18. A memory system comprising:

a memory module including a plurality of semiconductor memory devices and a control device configured to control the plurality of semiconductor memory devices, wherein the plurality of semiconductor memory devices and the control device are mounted on a circuit board; and a memory controller configured to control the memory module, wherein the control device is configured to receive a command, an address, and a clock signal from the memory controller and to provide the command, the address, and the clock signal to the plurality of semiconductor memory devices, wherein the control device, in a hidden training mode during a normal operation, is configured to performing a command/address training on at least one semiconductor memory device of the plurality of semiconductor memory devices by transmitting a first command/address signal and a first clock signal to the at least one semiconductor memory device, and receiving a second command/address signal and a second clock signal in response to the first command/address signal and the first clock signal, from the at least one semiconductor memory device, wherein the at least one semiconductor memory device includes a first loopback pin and a second loopback pin, the first loopback pin configured to transmit a data signal to the control device in an operation mode other than the hidden training mode, and to transmit the second command/address signal to the control device in the hidden training mode, and the second loopback pin configured to transmit a data strobe signal to the control device in the operation mode other than the hidden training mode, and to transmit the second clock signal to the control device in the hidden training mode, and the at least one semiconductor memory device configured to perform the command/address training using the first loopback pin and the second loopback pin in the hidden training mode.

19. The memory system of claim 18, wherein the at least one semiconductor memory device is configured to transmit the second command/address and the second clock signal to the control device through the first loopback pin and the second loopback pin, respectively, in the hidden training mode, under control of the control device.

20. A method of operating a memory module, wherein the memory module includes a plurality of semiconductor memory devices and a control device configured to control the plurality of semiconductor memory devices, and the plurality of semiconductor memory devices and the control device are mounted on a circuit board, the method comprising:

performing, by the control device, an initial command/address training on each of the plurality of semiconductor memory devices to store, in a register in the control device, initial skew information based on a skew between a command/address signal and a clock signal associated with each of the plurality of semiconductor memory devices in an initial training mode of the memory module;

performing a normal operation in each of the plurality of semiconductor memory devices based on a respective data signal and a respective data strobe signal;

determining, by the control device, whether at least one semiconductor memory device of the plurality of semiconductor memory devices enters into a hidden training mode during the normal operation;

receiving, by the at least one semiconductor memory device in the hidden training mode, a first command/address signal rather than the respective data signal, and a first clock signal rather than the respective data strobe signal;

transmitting, by the at least one semiconductor memory device in the hidden training mode, a second command/address signal based on the first command/address signal, and a second clock signal based on the first clock signal;

adjusting a skew, by the control device, by receiving the second command/address signal and the second clock signal from the at least one semiconductor memory device entering into in the hidden training mode; and performing, by the at least one semiconductor memory device, a normal operation based on the adjusted skew.

* * * * *